US010886467B2

(12) United States Patent
Miyazoe et al.

(10) Patent No.: US 10,886,467 B2
(45) Date of Patent: Jan. 5, 2021

(54) CBRAM BY SUBTRACTIVE ETCHING OF METALS

(71) Applicant: INTERNATIONAL BUSINESS MACHINES CORPORATION, Armonk, NY (US)

(72) Inventors: Hiroyuki Miyazoe, White Plains, NY (US); Qing Cao, Yorktown Heights, NY (US); Takashi Ando, Tuckahoe, NY (US); John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 16/401,693

(22) Filed: May 2, 2019

(65) Prior Publication Data
US 2020/0350499 A1 Nov. 5, 2020

(51) Int. Cl.
*H01L 29/02* (2006.01)
*H01L 45/00* (2006.01)

(52) U.S. Cl.
CPC ........ *H01L 45/1675* (2013.01); *H01L 45/085* (2013.01); *H01L 45/1233* (2013.01); *H01L 45/146* (2013.01); *H01L 45/148* (2013.01)

(58) Field of Classification Search
None
See application file for complete search history.

(56) References Cited

U.S. PATENT DOCUMENTS

| 8,426,839 | B1* | 4/2013 | Ma .................. H01L 45/1233 257/4 |
| 8,501,533 | B2* | 8/2013 | Cholet ................ H01L 45/142 438/102 |
| 9,306,161 | B1 | 4/2016 | Ma et al. |
| 9,595,670 | B1 | 3/2017 | Gee et al. |
| 9,711,713 | B1 | 7/2017 | Chou et al. |
| 9,831,426 | B2 | 11/2017 | Park |
| 10,157,965 | B2 | 12/2018 | Sciarrillo |
| 2015/0340611 | A1 | 11/2015 | Akhtar et al. |
| 2019/0115392 | A1* | 4/2019 | Bruce ................ H01L 45/1233 |

OTHER PUBLICATIONS

Baek et al., "Realization of Vertical Resistive Memory )VRRAM) using cost effective 3D Process", 2011 Internationa Electron Devices Meeting. Dec. 5, 2011. pp. 1-4.
Goux et al., "Electrochemical processes and device improvement in conductive bridge RAM cells", physica status solidi(a). vol. 213. No. 2. Feb. 2016. pp. 274-288.
Wong et al., "Metal-Oxide RRAM", Proceedings of the IEEE. vol. 100. No. 6. Jun. 2012. pp. 1951-1970.

* cited by examiner

*Primary Examiner* — Hung K Vu
(74) *Attorney, Agent, or Firm* — Tutunjian & Bitetto, P.C.; Randall Bluestone

(57) ABSTRACT

A method is presented for constructing conductive bridging random access memory (CBRAM) stacks. The method includes forming a plurality of conductive lines within an interlayer dielectric (ILD), forming a CBRAM stack including at least an electrolyte layer, a conductive layer, a metal cap layer, and a top electrode such that a top end of the CBRAM stack has a smaller critical dimension than a bottom end of the CBRAM stack, forming a low-k dielectric layer over the CBRAM stack, and exposing a top surface of the CBRAM stack during a via opening.

18 Claims, 6 Drawing Sheets

CBRAM BY SUBTRACTIVE ETCHING OF METALS

BACKGROUND

The present invention relates generally to semiconductor devices, and more specifically, to a conductive bridging random access memory (CBRAM) constructed by subtractive etching of metals.

CBRAM is considered a promising technology for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a crossbar array of CBRAMs, which can express a fully-connected neural network configuration.

SUMMARY

In accordance with an embodiment, a method is provided for constructing conductive bridging random access memory (CBRAM) stacks. The method includes forming a plurality of conductive lines within an interlayer dielectric (ILD), forming a CBRAM stack including at least an electrolyte layer, a conductive layer, a metal cap layer, and a top electrode such that a top end of the CBRAM stack has a smaller critical dimension than a bottom end of the CBRAM stack, forming a low-k dielectric layer over the CBRAM stack, and exposing a top surface of the CBRAM stack during a via opening.

In accordance with another embodiment, a method is provided for constructing conductive bridging random access memory (CBRAM) stacks. The method includes forming a plurality of conductive lines within an interlayer dielectric (ILD), forming a metal nitride layer in direct contact with a conductive line of the plurality of conductive lines, and forming a CBRAM stack including at least an electrolyte layer, a conductive layer, a metal cap layer, and a top electrode such that a top end of the CBRAM stack has a smaller critical dimension than a bottom end of the CBRAM stack.

In accordance with yet another embodiment, a semiconductor device is provided for constructing conductive bridging random access memory (CBRAM) stacks. The semiconductor device includes a plurality of conductive lines disposed within an inter-layer dielectric (ILD), a barrier layer disposed in direct contact with a conductive line of the plurality of conductive lines, a bottom electrode disposed over the barrier layer, an electrolyte layer disposed over the bottom electrode, a conductive layer disposed over the electrolyte layer, a metal cap layer disposed over the conductive layer, a top electrode disposed over the metal cap layer to define a CBRAM stack, where a top end of the CBRAM stack has a smaller critical dimension than a bottom end of the CBRAM stack, and spacers disposed adjacent the bottom electrode, the electrolyte layer, the conductive layer, the metal cap layer, and the top electrode, the spacers extending vertically beyond a top surface of the top electrode.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing conductive bridging random access memory (CBRAM) devices by a subtractive etching method. The CBRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of CBRAMs, which can be configured as a fully-connected neural network.

CBRAM has a structure in which a solid electrolyte layer is formed between top and bottom electrodes, and can have a high current density by forming a metal bridge inside the solid electrolyte layer. Such a CBRAM is a device exhibiting bidirectional switching behavior, which maintains a low resistance state by allowing metal cations to be drifted into the solid electrolyte layer to form a metal bridge according to application of a positive voltage to the top electrode, and maintains a high resistance state by allowing a part of the metal bridge to be cut according to application of a negative voltage.

Embodiments in accordance with the present invention provide methods and devices for constructing CBRAM structures between metal lines, where each CBRAM structure includes a bottom electrode, an electrolyte layer, a metal layer, a metal cap layer, and a top electrode. Such CBRAM structures fall under resistive memory technology (RRAM) offering performance, power/energy, reliability, and cost advantages over incumbent nonvolatile memory technologies. The CBRAM structures of the exemplary embodiments feature significantly less energy consumption than today's leading memories without sacrificing performance and reliability. With a unique combination of fast, low energy operation, the CBRAM structures of the exemplary embodiments are an ideal match for Internet-of-Things (IoT) and other energy-conscious applications.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
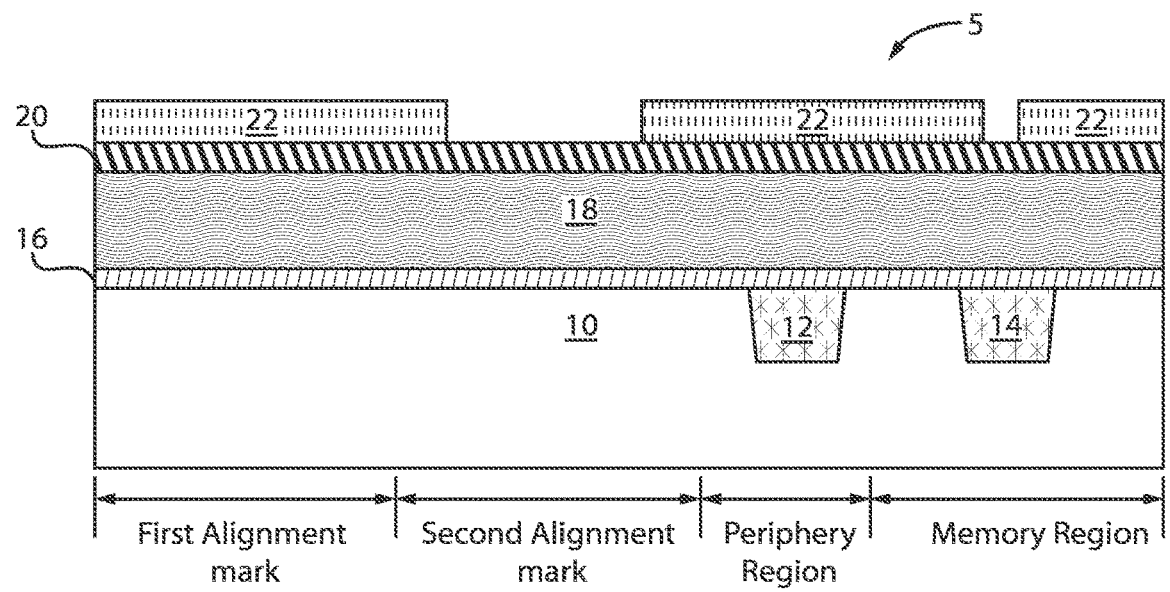
FIG. 1 is a cross-sectional view of a semiconductor structure including a plurality of conductive lines formed within a dielectric layer, where an organic planarization layer (OPL), an anti-reflective coating (ARC) layer, and a photoresist are deposited over the plurality of conductive lines, in accordance with an embodiment of the present invention.

FIG. 1 is a cross-sectional view of a semiconductor structure including a plurality of conductive lines formed within a dielectric layer, where an organic planarization layer (OPL), an anti-reflective coating (ARC) layer, and a photoresist are deposited over the plurality of conductive lines, in accordance with an embodiment of the present invention.

A semiconductor structure 5 includes a plurality of conductive lines 12, 14 formed within an inter-layer dielectric (ILD) 10. A dielectric cap layer 16 can be formed over the conductive lines 12, 14. An organic planarization layer (OPL) or organic dielectric layer (ODL) 18 can then be formed over the dielectric cap layer 16. Additionally, an anti-reflective coating (ARC) layer 20 and a photoresist layer 22 can be formed over portions of the OPL 18. Moreover, the structure 5 can be defined within, e.g., four regions. The first region can designate a first alignment mark, the second region can designate a second alignment mark, the third region can designate a periphery region, and the fourth region can designate a memory region. Alignment marks are used to align the wafer such that subsequent layers are formed at the correct location relative to underlying features. For example, alignment marks can be used to form the vias and conductive lines in the metallization layers in the correct location to make electrical contact to the devices, such as transistors, formed in the underlying substrate.

The ILD 10 can include any materials known in the art, such as, for example, porous silicates, carbon doped oxides, silicon dioxides, silicon nitrides, silicon oxynitrides, or other dielectric materials. The ILD 10 can be formed using any method known in the art, such as, for example, chemical vapor deposition, plasma enhanced chemical vapor deposition, atomic layer deposition, or physical vapor deposition. The ILD 10 can have a thickness ranging from about 25 nm to about 200 nm.

The dielectric material of layer 10 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 12, 14 can be formed in the openings or trenches formed in the ILD 10. The metal lines 12, 14 can be any conductive materials known in the art, such as, for example, copper (Cu), aluminum (Al), or tungsten (W). The metal lines 12, 14 can be fabricated using any technique known in the art, such as, for example, a single or dual damascene technique. In an embodiment, not illustrated, the metal lines 12, 14 can be copper (Cu) and can include a metal liner, where a metal liner can be metals, such as, for example, tantalum nitride and tantalum (TaN/Ta), titanium, titanium nitride, cobalt, ruthenium, and manganese.

The dielectric cap layer 16 can be referred to as a barrier layer. The dielectric material of the dielectric cap layer 16 can be silicon nitride (SiN).

The OPL 18 and the ARC layer 20 can be employed as a lithographic stack to pattern the underlying layers. The OPL 18 can be formed at a predetermined thickness to provide reflectivity and topography control during etching of the hard mask layers below. The OPL 18 can include an organic material, such as a polymer. The thickness of the OPL 18 can be in a range from about 50 nm to about 300 nm. In one example, the thickness of the OPL 18 is about 135 nm.

The layer 20 is an ARC layer which minimizes the light reflection during lithography for a lithography stack. The ARC layer 20 can include silicon, for example, a silicon anti-reflective layer (SiARC). The thickness of the ARC layer 20 can be in range from about 10 nm to about 100 nm. The anti-reflective film layer 20 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material 22 (e.g., a material that will react when exposed to light), and then selectively exposing portions of the photoresist 22 to light or other ionizing radiation (e.g., ultraviolet, electron beams, X-rays, etc.), thereby changing the solubility of portions of the material. The resist 22 is then developed by washing the resist with a developer solution, such as, e.g., tetramethylammonium hydroxide (TMAH), thereby removing non-irradiated (in a negative resist) or irradiated (in a positive resist) portions of the resist layer.

Figure 2:
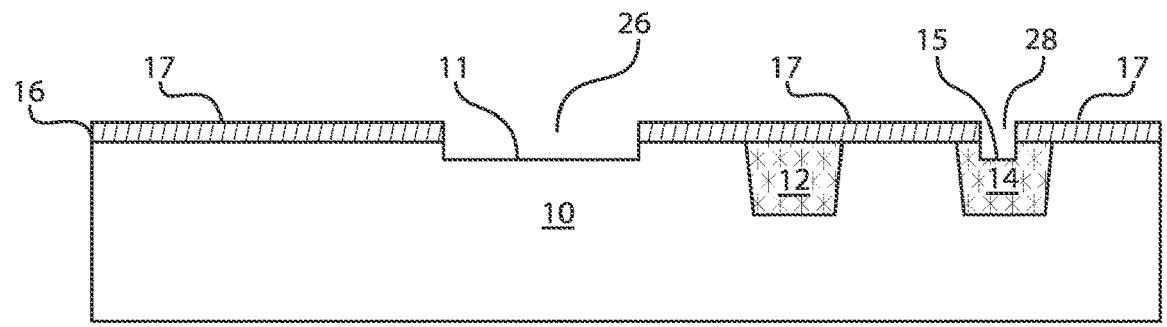
FIG. 2 is a cross-sectional view of the semiconductor structure of FIG. 1 where the photoresist is removed, and the OPL and ARC layer are etched to expose a top surface of one or more of the conductive lines, in accordance with an embodiment of the present invention.

FIG. 2 is a cross-sectional view of the semiconductor structure of FIG. 1 where the photoresist is removed, and the OPL and ARC layer are etched to expose a top surface of one or more of the conductive lines, in accordance with an embodiment of the present invention.

In various example embodiments, the OPL 18, the ARC layer 20, and the photoresist 22 are etched to form an opening or trench 26 to expose a top surface 11 of the ILD 10 and to form an opening or trench 28 to expose a top surface 15 of conductive line 14. Additionally, a top surface 17 of the dielectric cap layer 16 is exposed.

Figure 3:
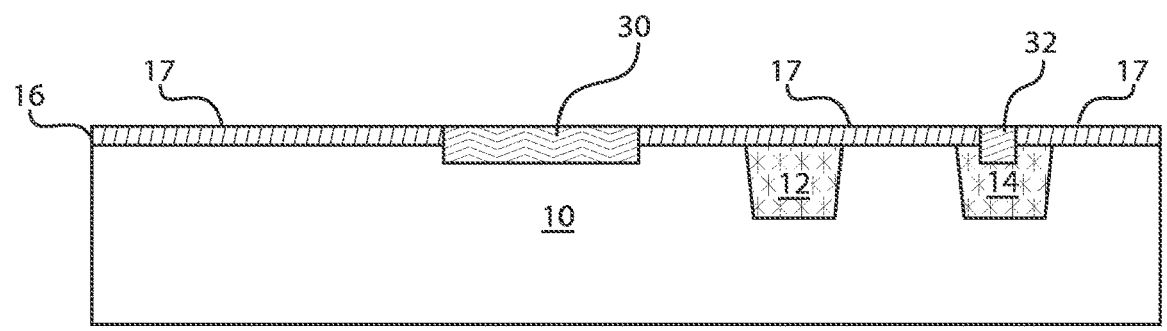
FIG. 3 is a cross-sectional view of the semiconductor structure of FIG. 2 where a metal nitride layer is deposited in a recess of the dielectric layer and reduced by chemical-mechanical polishing (CMP), in accordance with an embodiment of the present invention.

FIG. 3 is a cross-sectional view of the semiconductor structure of FIG. 2 where a metal nitride layer is deposited in a recess of the dielectric layer and reduced by chemical-mechanical polishing (CMP), in accordance with an embodiment of the present invention.

In various example embodiments, a metal nitride liner is deposited and then recessed by, e.g., CMP such that a first metal nitride layer 30 is formed in the trench 26 and a second metal nitride layer 32 is formed in the trench 28 and over the conductive line 14. The first and second metal nitride layers 30, 32 are planarized by, e.g., CMP, such that top surfaces of the first and second metal nitride layers 30, 32 are flush with a top surface 17 of the dielectric cap layer 16. In a preferred embodiment, the first and second metal nitride layers 30, 32 are tantalum nitride (TaN) layers. The metal nitride layers 30, 32 can be referred to as barrier layers.

Figure 4:
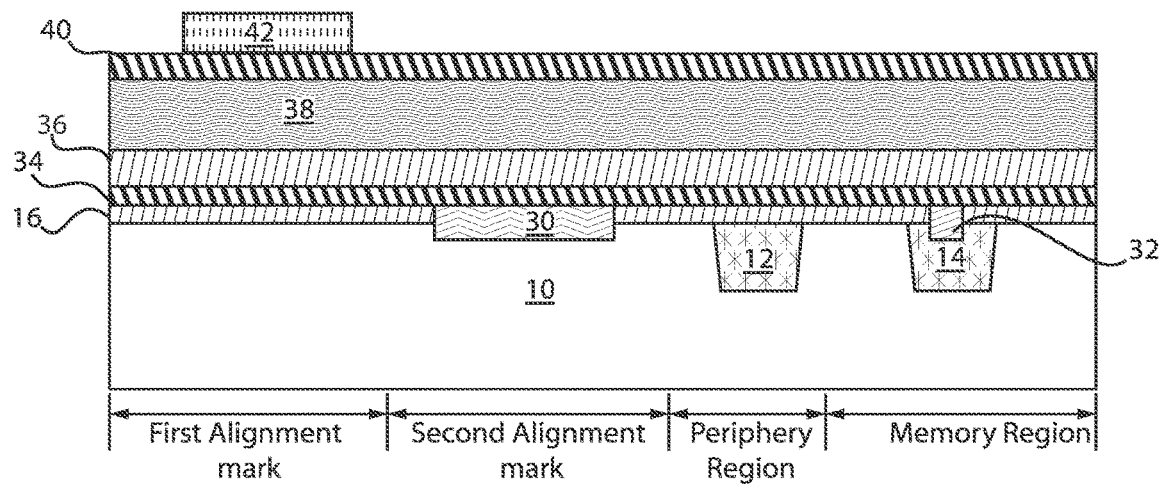
FIG. 4 is a cross-sectional view of the semiconductor structure of FIG. 3 where a bottom electrode, a hardmask, an organic planarization layer (OPL), an anti-reflective coating (ARC) layer, and a photoresist are deposited, in accordance with an embodiment of the present invention.

FIG. 4 is a cross-sectional view of the semiconductor structure of FIG. 3 where a bottom electrode, a hardmask, an organic planarization layer (OPL), an anti-reflective coating (ARC) layer, and a photoresist are deposited, in accordance with an embodiment of the present invention.

In various example embodiments, a bottom electrode 34 is deposited. The bottom electrode 34 is in direct contact with the first and second metal nitride layers 30, 32. Then a hardmask 36 is deposited over the bottom electrode 34.

The bottom electrode 34 can include a conductive material, such as Cu, Al, Ag, Au, Pt, W, etc. In some embodiments, the bottom electrode 34 can include nitrides such as TiN, TaN, Ta or Ru. In a preferred embodiment, the bottom electrode 34 is TiN.

In various example embodiments, the hardmask layer 36 can be a nitride, for example, a silicon nitride (SiN), an oxynitride, for example, silicon oxynitride (SiON), or a combination thereof. In a preferred embodiment, the hardmask layer 36 can be silicon nitride (SiN), for example, $Si_3N_4$.

In one or more embodiments, the hardmask layer 36 can have a thickness in the range of about 20 nm to about 100 nm, or in the range of about 35 nm to about 75 nm, or in the range of about 45 nm to about 55 nm, although other thicknesses are contemplated.

Subsequently, an organic planarization layer (OPL) or organic dielectric layer (ODL) 38 can then be formed over the hardmask layer 36. Additionally, an anti-reflective coating (ARC) layer 40 and a photoresist layer 42 can be formed over portions of the OPL 38. The thickness of the OPL 38 can be in a range from about 50 nm to about 300 nm. In one example, the thickness of the OPL 38 is about 100 nm.

Figure 5:
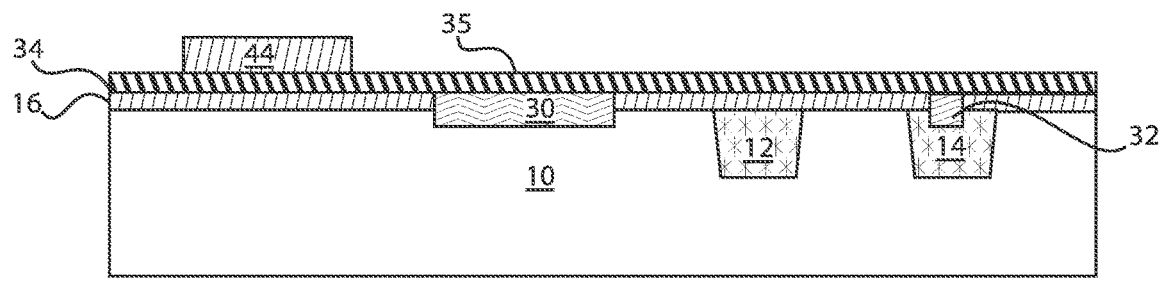
FIG. 5 is a cross-sectional view of the semiconductor structure of FIG. 4 where the OPL, the ARC layer, and the photoresist are etched such that a portion of the hardmask remains over the bottom electrode, in accordance with an embodiment of the present invention.

FIG. 5 is a cross-sectional view of the semiconductor structure of FIG. 4 where the OPL, the ARC layer, and the photoresist are etched such that a portion of the hardmask remains over the bottom electrode, in accordance with an embodiment of the present invention.

In various example embodiments, the OPL 38, the ARC layer 40, and the photoresist 42 are etched to form a hardmask portion 44 over the bottom electrode 34. Additionally, a top surface 35 of the bottom electrode 34 is exposed. The hardmask portion 44 is offset from the conductive lines 12, 14. The hardmask portion 44 is offset from the first and second metal nitride layers 30, 32.

Figure 6:
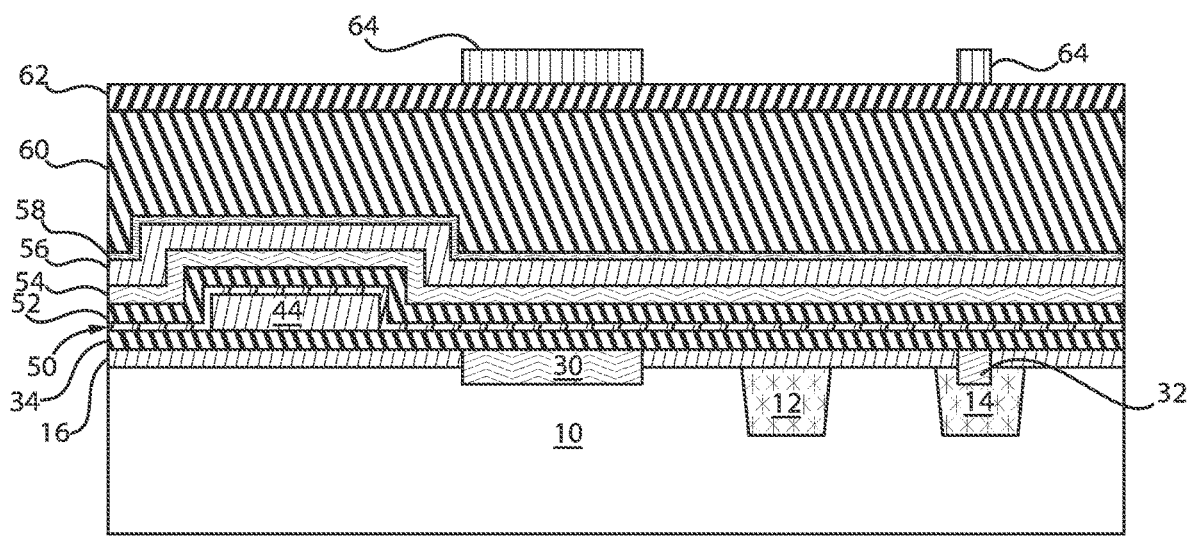
FIG. 6 is a cross-sectional view of the semiconductor structure of FIG. 5 where a conductive bridging random access memory (CBRAM) stack is formed, and then another lithography stack is deposited over the CBRAM stack, in accordance with an embodiment of the present invention.

FIG. 6 is a cross-sectional view of the semiconductor structure of FIG. 5 where a conductive bridging random access memory (CBRAM) stack is formed, and then another lithography stack is deposited over the CBRAM stack, in accordance with an embodiment of the present invention.

In various example embodiments, the CBRAM stack is formed and includes a first layer 50, a second layer 52, a third layer 54, a fourth layer 56, and a fifth layer 58. The first layer 50 can be an electrolyte layer, e.g., a silicon monoxide (SiO) hardmask layer, the second layer 52 can be a conductive layer, e.g., a copper (Cu) layer, the third layer 54 can be a metal cap layer, e.g., a ruthenium (Ru) layer, the fourth layer 56 can be, e.g., a tantalum nitride (TaN) layer, and the fifth layer 58 can be, e.g., hardmask layer, such as a SiO and a SiN hardmask layer. The second, third, and fourth layers 52, 54, 56 can be referred to as metal layers. At least one of these layers can be formed from a thermally stable metal, such as TiN, TaN, TaC, TiAlN, TaAlN, or their derivatives.

In various embodiments, a lithographic stack can be formed over the CBRAM stack. The lithographic stack can include an organic planarization layer (OPL) or organic dielectric layer (ODL) 60 that can be formed over the hardmask layer 58 of the CBRAM stack. Additionally, an anti-reflective coating (ARC) layer 62 and a photoresist layer 64 can be formed over portions of the OPL 60. The thickness of the OPL 60 can be in a range from about 50 nm to about 300 nm. In one example, the thickness of the OPL 60 is about 200 nm.

Figure 7:
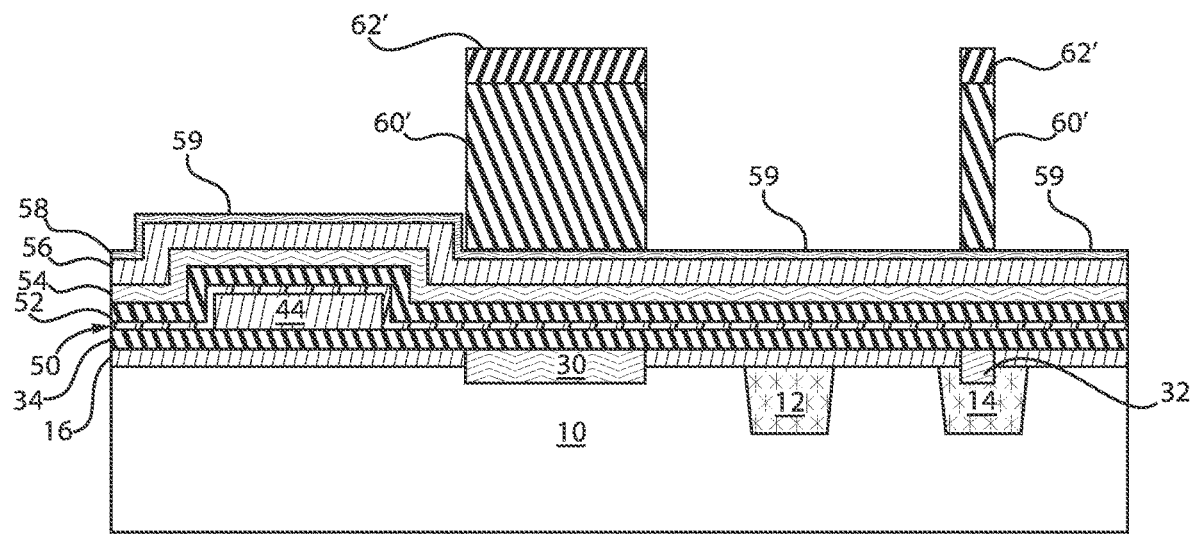
FIG. 7 is a cross-sectional view of the semiconductor structure of FIG. 6 where the OPL is etched, in accordance with an embodiment of the present invention.

FIG. 7 is a cross-sectional view of the semiconductor structure of FIG. 6 where the OPL is etched, in accordance with an embodiment of the present invention.

In various example embodiments, the OPL 60 is etched to form OPL regions 60'. Additionally, ARC layers 62' remain over the OPL regions 60'. A top surface 59 of the hardmask layer 58 is also exposed.

Figure 8:
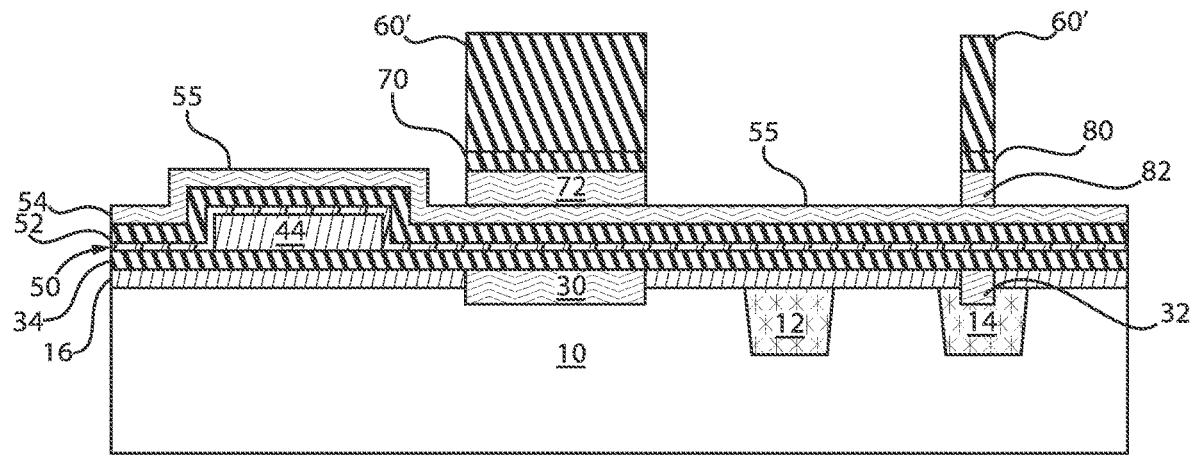
FIG. 8 is a cross-sectional view of the semiconductor structure of FIG. 7 where sacrificial layers are etched to expose a top metal layer, in accordance with an embodiment of the present invention.

FIG. 8 is a cross-sectional view of the semiconductor structure of FIG. 7 where sacrificial layers are etched to expose a top metal layer, in accordance with an embodiment of the present invention.

In various example embodiments, the fourth layer 56 (TaN layer) and the fifth layer 58 (SiO) layer are removed by etching, e.g., dry etching. A top surface 55 of the third layer 54 (Cu layer) is now exposed. Additionally, CBRAM stacks are beginning to take shape as a first layer 72 and a second layer 70 are formed under the first OPL region 60' for a first CBRAM structure and a first layer 82 and a second layer 80 are formed under the second OPL region 60' for the second CBRAM structure. The first and second layers 72, 70 are aligned with the metal nitride layer 30 and the first and second layers 82, 80 are aligned with the metal nitride layer 32.

The dry etching process can implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), oxygen-containing gas, iodine-containing gas, other suitable gases and/or plasmas, or combinations thereof. The etching process can include a multiple-step etching to gain etch selectivity, flexibility and desired etch profile.

Figure 9:
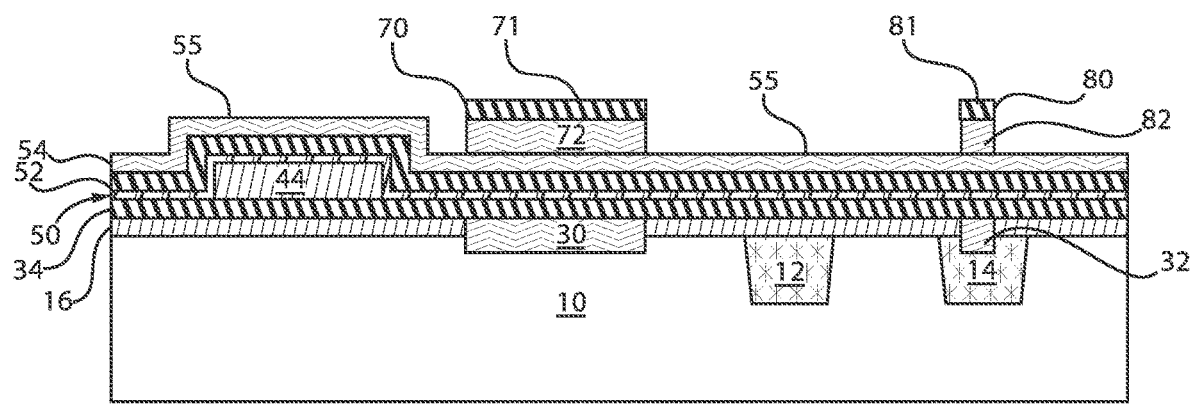
FIG. 9 is a cross-sectional view of the semiconductor structure of FIG. 8 where the OPL is stripped, in accordance with an embodiment of the present invention.

FIG. 9 is a cross-sectional view of the semiconductor structure of FIG. 8 where the OPL is stripped, in accordance with an embodiment of the present invention.

In various example embodiments, the OPL regions 60' are etched to expose a top surface 71 of the first CBRAM structure and a top surface 81 of the second CBRAM structure. Plasma etching can be used to etch the OPL regions 60'.

Figure 10:
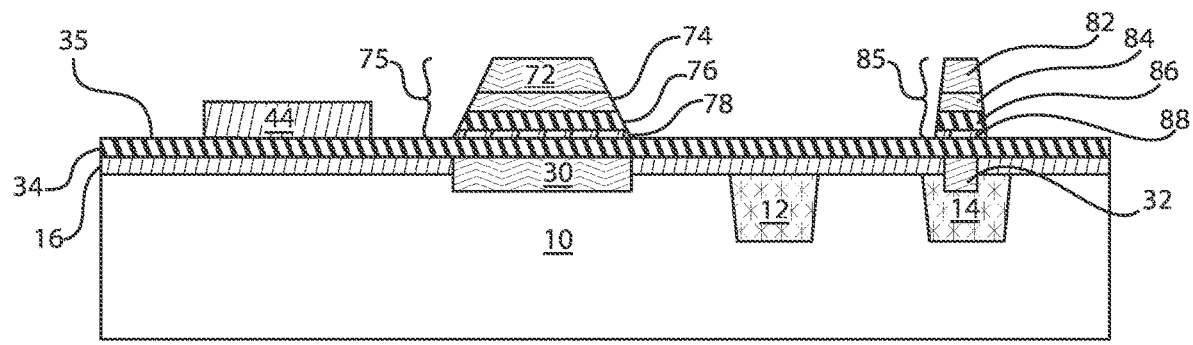
FIG. 10 is a cross-sectional view of the semiconductor structure of FIG. 9 where remaining metal layers are etched to form two CBRAM stacks, in accordance with an embodiment of the present invention.

FIG. 10 is a cross-sectional view of the semiconductor structure of FIG. 9 where remaining metal layers are etched to form two CBRAM stacks, in accordance with an embodiment of the present invention.

In various example embodiments, the first, second, and third layers 50, 52, 54 are etched to form the CBRAM stacks 75, 85. A top surface 35 of the bottom electrode 34 is also exposed.

The first CBRAM stack 75 includes 5 layers. The first layer 72 can be a TaN layer, the second layer 74 can be a ruthenium (Ru) layer, the third layer 76 can be a copper (Cu) layer, and the fourth layer 78 can be a silicon monoxide (SiO) layer. The fourth layer 78 is formed over the bottom electrode 34 that completes the CBRAM stack 75. In one example embodiment, the bottom electrode 34 can be optional.

Similarly, the second CBRAM stack 85 includes 4 layers. The first layer 82 can be a TaN layer, the second layer 84 can be a ruthenium (Ru) layer, the third layer 86 can be a copper (Cu) layer, and the fourth layer 88 can be a silicon monoxide (SiO) layer. The fourth layer 88 is formed over the bottom electrode 34 that completes the CBRAM stack 85. In one example embodiment, the bottom electrode 34 can be optional.

Therefore, the CBRAM stacks 75, 85 are built between metal lines 12, 14, the CBRAM bottom electrode 34 can be, e.g., TiN, TaN, or W and the CBRAM top electrode can be, e.g., Ti, TiN, Ta, TaN or W.

Figure 11:
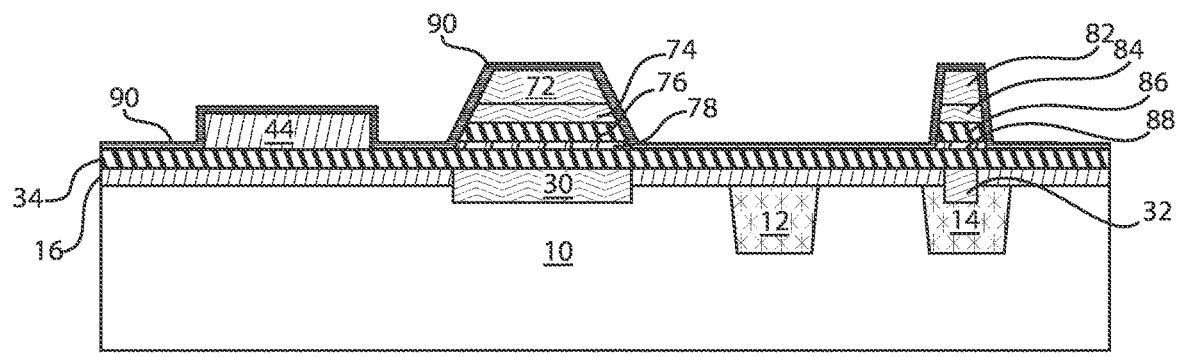
FIG. 11 is a cross-sectional view of the semiconductor structure of FIG. 10 where a dielectric layer is deposited, in accordance with an embodiment of the present invention.

FIG. 11 is a cross-sectional view of the semiconductor structure of FIG. 10 where a dielectric layer is deposited, in accordance with an embodiment of the present invention.

In various example embodiments, a SiN encapsulation 90 takes place. The SiN layer 90 encapsulates both the first and second CBRAM stacks 75, 85.

Figure 12:
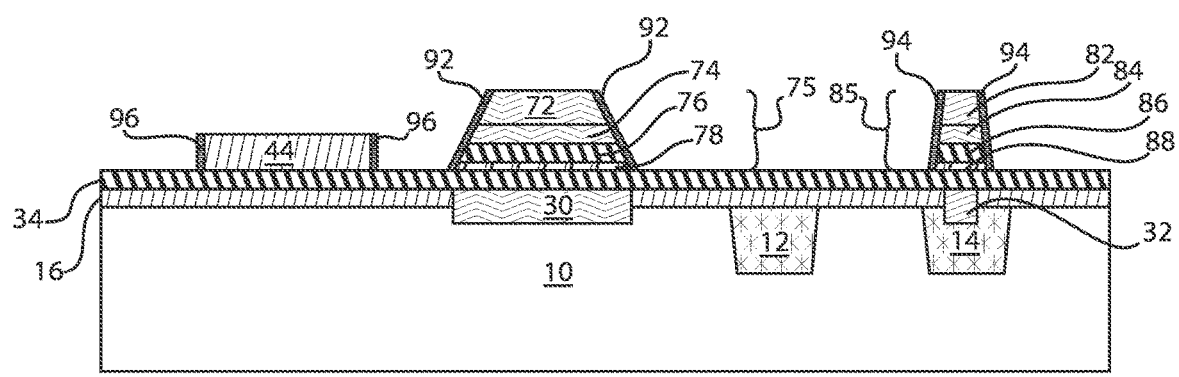
FIG. 12 is a cross-sectional view of the semiconductor structure of FIG. 11 where the dielectric layer is etched to form spacers adjacent the two CBRAM stacks, in accordance with an embodiment of the present invention.

FIG. 12 is a cross-sectional view of the semiconductor structure of FIG. 11 where the dielectric layer is etched to form spacers adjacent the two CBRAM stacks, in accordance with an embodiment of the present invention.

In various example embodiments, the SiN layer 90 is etched to form spacers 92 adjacent the first CBRAM stack 75, spacers 94 adjacent the second CBRAM stack 85, and spacers 96 adjacent the SiN hardmask portion 44. The SiN layer 90 can be selectively etched by, e.g., RIE. The etch also results in the exposure of the top surfaces of the layers 72, 82 of the first and second CBRAM stacks 75, 85, respectively.

Figure 13:
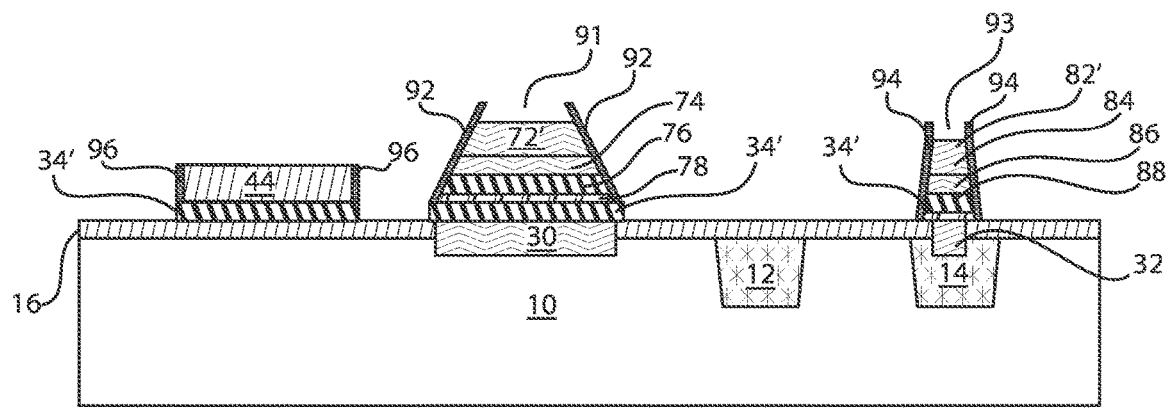
FIG. 13 is a cross-sectional view of the semiconductor structure of FIG. 12 where a top layer of the two CBRAM stacks is partially etched, in accordance with an embodiment of the present invention.

FIG. 13 is a cross-sectional view of the semiconductor structure of FIG. 12 where a top layer of the two CBRAM stacks is partially etched, in accordance with an embodiment of the present invention.

In various example embodiments, the layers 72, 82 are partially etched such that the first CBRAM stack 75 includes a remaining first layer 72' and the second CBRAM stack 85 includes a remaining first layer 82'. A recess or gap region 91 is formed between the spacers 92 of the first CBRAM stack 75 and a recess or gap region 93 is formed between the spacers 94 of the second CBRAM stack 85. Additionally, the bottom electrode is etched such that bottom electrode portions 34' remain.

Figure 14:
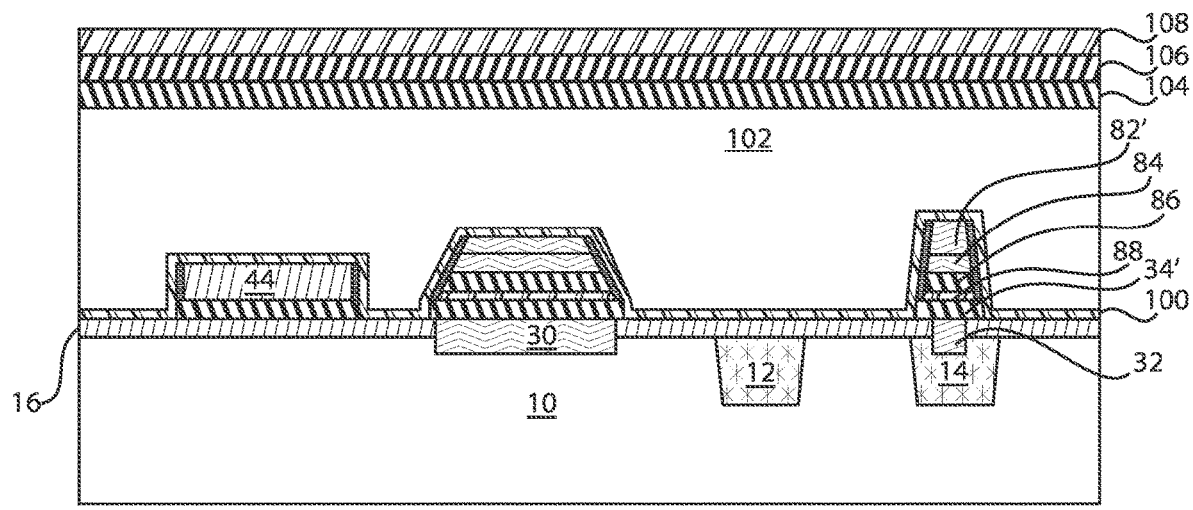
FIG. 14 is a cross-sectional view of the semiconductor structure of FIG. 13 where an interlayer dielectric (ILD) and a plurality of sacrificial layers are deposited, in accordance with an embodiment of the present invention.

FIG. 14 is a cross-sectional view of the semiconductor structure of FIG. 13 where an interlayer dielectric (ILD) and a plurality of sacrificial layers are deposited, in accordance with an embodiment of the present invention.

In various example embodiments, a SiN encapsulation 100 takes place. The SiN encapsulation 100 fills the gap region 91 of the first CBRAM stack 75 and the gap region 92 of the second CBRAM stack 85. The SiN encapsulation 100 encapsulates or encompasses or envelopes the first and second CBRAM stacks 75, 85.

In various example embodiments, a low-k dielectric layer 102 is then deposited over the SiN encapsulation 100. A low-k dielectric material as used in the low-k dielectric layer 102 can have a dielectric constant that is less than 4.0, e.g., 3.9. In one embodiment, the low-k material layer 102 can have a dielectric constant ranging from about 1.0 to about 3.5. In another embodiment, the low-k material layer 102 can have a dielectric constant ranging from about 1.75 to about 3.2.

One example of a material suitable for the low-k materials for the low-k dielectric layer 102 can include silicon oxycarbonitride (SiOCN). Other low-k materials that can also be used for the low-k dielectric layer 102 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some example embodiments, the low-k dielectric layer 102 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed. In some embodiments, the low-k dielectric layer 102 can have a thickness ranging from about 5 nm to about 30 nm. In another embodiment, the low-k dielectric layer 102 can have a thickness ranging from about 7 nm to about 15 nm.

Subsequently, a plurality of sacrificial layers can be deposited. In one example, a first sacrificial layer 104, a second sacrificial layer 106, and a third sacrificial layer 108 are deposited over the low-k dielectric layer 102. In one example, the first sacrificial layer 104 can be a SiN layer, the second sacrificial layer 106 can be a TiN hardmask, and the third sacrificial layer 108 can be a TEOS hard mask (tetraethyl orthosilicate, $Si(OC_2H_5)_4$).

Figure 15:
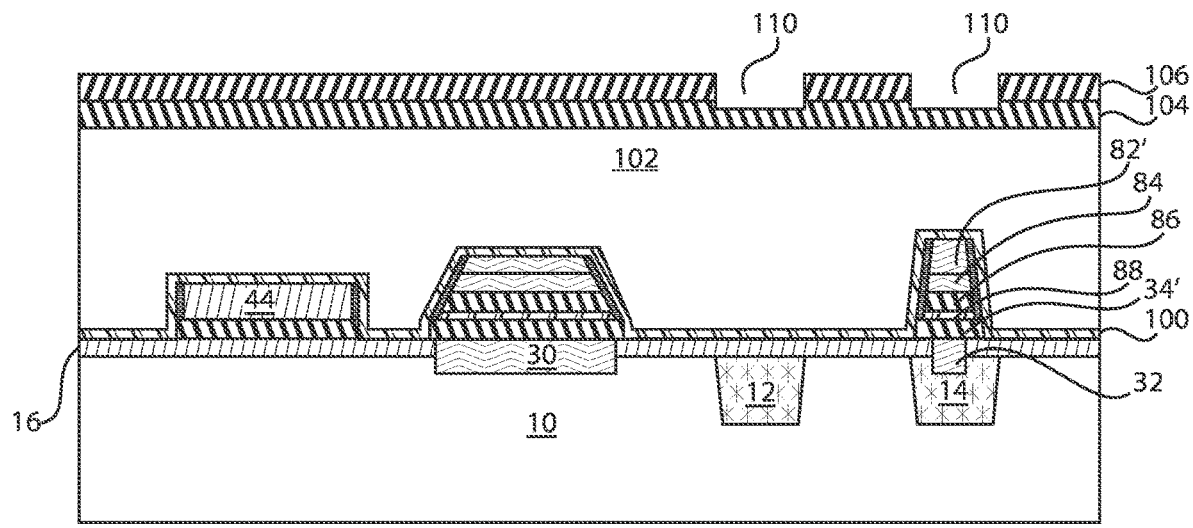
FIG. 15 is a cross-sectional view of the semiconductor structure of FIG. 14 where the sacrificial layers are etched to form openings directly over the plurality of conductive lines, in accordance with an embodiment of the present invention.

FIG. 15 is a cross-sectional view of the semiconductor structure of FIG. 14 where the sacrificial layers are etched to form openings directly over the plurality of conductive lines, in accordance with an embodiment of the present invention.

In various example embodiments, the second and third sacrificial layers 106, 108 can be etched by, e.g., RIE, to create a first opening or recess 110 over the conductive line 12 and to create a second opening or recess 110 over the conductive line 14. The first sacrificial layer 104 is not removed. The top surface of the first sacrificial layer 104 remains intact in the first and second openings 110. The third sacrificial layer 108 is completely removed such that a top surface of the second sacrificial layer 106 is exposed in areas where the openings 110 do not occur.

Figure 16:
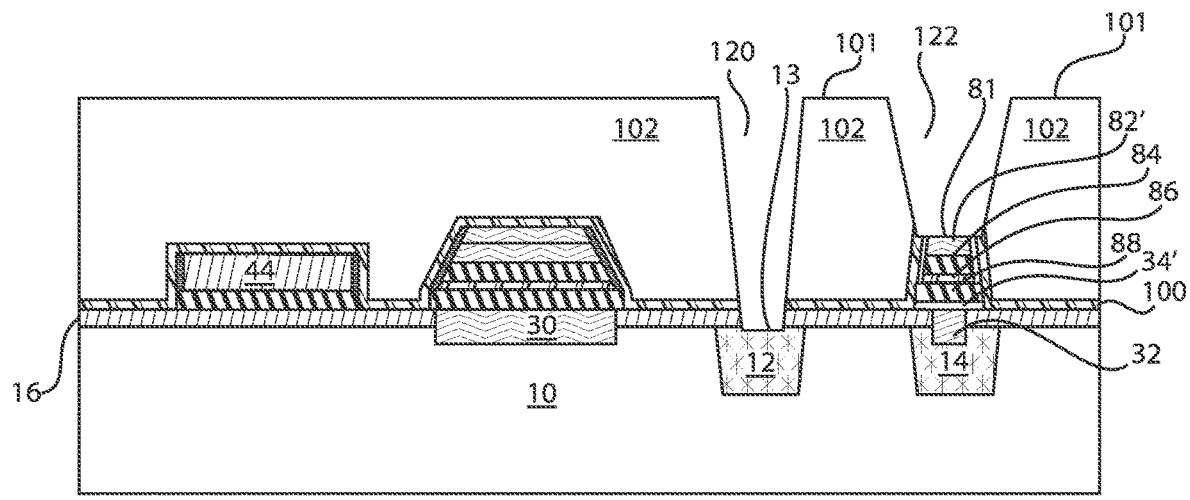
FIG. 16 is a cross-sectional view of the semiconductor structure of FIG. 15 where the CBRAM stack formed over the conductive line is exposed, in accordance with an embodiment of the present invention.

FIG. 16 is a cross-sectional view of the semiconductor structure of FIG. 15 where the CBRAM stack formed over the conductive line is exposed, in accordance with an embodiment of the present invention.

In various example embodiments, vias are formed. A first via 120 extends to a top surface 13 of the conductive line 12 and a second via 122 extends to a top surface 81 of the layer 82'. Additionally, spacers 94 are maintained. The CBRAM structure includes the bottom electrode portion 34', the electrolyte layer 78, the conductive layer 76 (e.g., Cu), the metal cap layer 74 (e.g., Ru), and the top electrode 72 (e.g., TaN).

In a conventional damascene process, the Cu pillars with the smaller critical dimension (CD) are at the bottom end. In contrast, in the exemplary embodiments of the present invention, by employing subtractive patterning, the CBRAM stack has a smaller CD at the top end of the CBRAM pillar and a larger CD at the bottom end of the CBRAM pillar. Therefore, a top end of the CBRAM stack has a smaller critical dimension than the bottom end of the CBRAM stack.

In various embodiments, the first and second sacrificial layers 104, 106 are also completely removed to expose a top surface 101 of the low-k dielectric layer 102.

Figure 17:
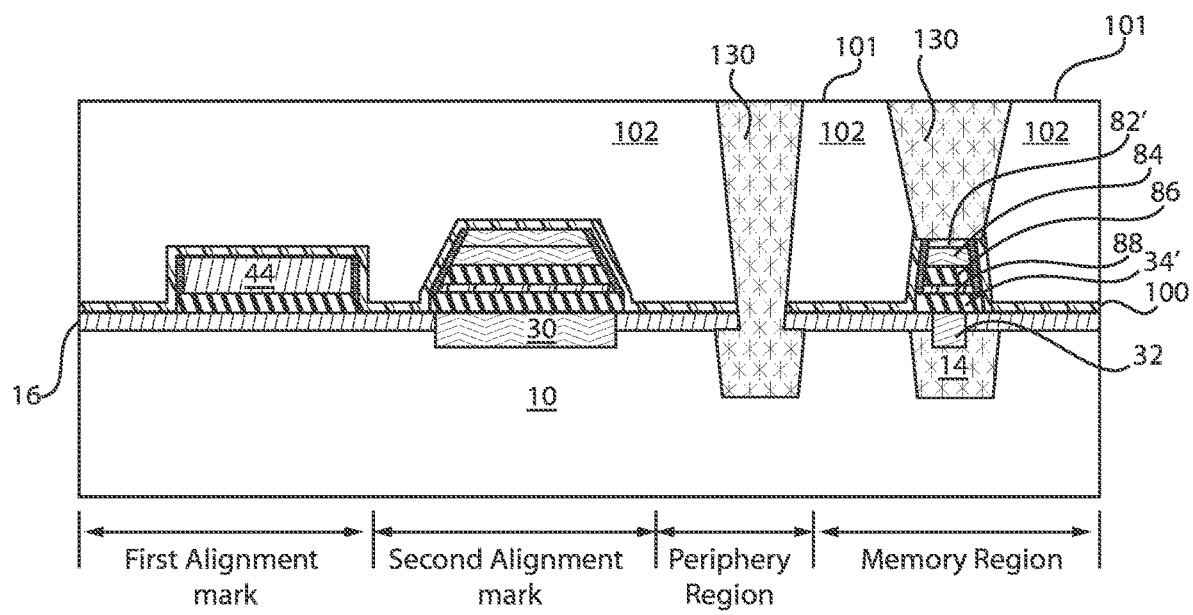
FIG. 17 is a cross-sectional view of the semiconductor structure of FIG. 16 where a metal fill takes place, the metal fill being planarized, in accordance with an embodiment of the present invention.

FIG. 17 is a cross-sectional view of the semiconductor structure of FIG. 16 where a metal fill takes place, the metal fill being planarized, in accordance with an embodiment of the present invention.

In various example embodiments, a conductive material 130 can be deposited. The metallization can be a single damascene metallization. Thus, only single damascene metallization is needed for the trench, thus enabling dynamic reflow or other fill techniques that are sensitive to pattern and profile needs. The conductive material 130 can be metals include copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 130 can be reduced by chemical-mechanical polishing (CMP) and/or etching. Therefore, the planarization process can be provided by CMP. Other planarization process can include grinding and polishing.

In various example embodiments, the bottom electrode 34 or bottom electrode portions 34' can be optional. In other words, the SiO layer can directly contact the second metal nitride layer 32.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

In conclusion, a structure for a CBRAM is built or constructed by a subtractive etching method. The CBRAM stacks are built between Cu lines. The CBRAM bottom electrode can be, e.g., TiN, TaN, or W. The CBRAM electrolyte can be, e.g., SiO, a-Si. The CBRAM conductive element can be, e.g., Cu, Ag. The CBRAM metal cap on the conductive element can be, e.g., Ru, Ir, Pt. The CBRAM top electrode can be, e.g., Ti, TiN, Ta, TaN, or W and combination thereof. The CBRAM encapsulation or spacer can be, e.g., SiN. The bottom electrode, the electrolyte layer, the conductive layer, the metal cap layer, and the top electrode can collectively form the CBRAM structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for constructing a CBRAM with subtractive methods (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for constructing conductive bridging random access memory (CBRAM) stacks, the method comprising:
   forming a plurality of conductive lines within an interlayer dielectric (ILD);
   forming a CBRAM stack including at least an electrolyte layer, a conductive layer, a metal cap layer, and a top electrode such that a top end of the CBRAM stack has a smaller critical dimension than a bottom end of the CBRAM stack;
   forming a low-k dielectric layer over the CBRAM stack; and
   exposing a top surface of the CBRAM stack during a via opening.

2. The method of claim 1, further comprising forming a barrier layer over a conductive line of the plurality of conductive lines in alignment with the CBRAM stack.

3. The method of claim 2, further comprising forming an encapsulation layer over the CBRAM stack.

4. The method of claim 3, further comprising etching the encapsulation layer to form spacers adjacent the CBRAM stack.

5. The method of claim 4, further comprising selectively recessing the plurality of sacrificial layers to create an opening in alignment with the CBRAM stack.

6. The method of claim 5, wherein the plurality of sacrificial layers includes a first sacrificial layer, a second sacrificial layer, and a third sacrificial layer.

7. The method of claim 1, further comprising filling the via opening with a conductive material.

8. The method of claim 1, wherein the electrolyte layer is a silicon monoxide (SiO) layer, the conductive layer includes copper (Cu), and the metal cap layer includes ruthenium (Ru).

9. The method of claim 1, wherein the CBRAM stack further includes a bottom electrode.

10. A method for constructing conductive bridging random access memory (CBRAM) stacks, the method comprising:
forming a plurality of conductive lines within an interlayer dielectric (ILD);
forming a metal nitride layer in direct contact with a conductive line of the plurality of conductive lines; and
forming a CBRAM stack including at least an electrolyte layer, a conductive layer, a metal cap layer, and a top electrode such that a top end of the CBRAM stack has a smaller critical dimension than a bottom end of the CBRAM stack.

11. The method of claim 10, wherein the CBRAM stack further includes a bottom electrode, the bottom electrode in direct contact with the metal nitride layer.

12. The method of claim 11, further comprising forming an encapsulation layer over the CBRAM stack.

13. The method of claim 12, further comprising etching the encapsulation layer to form spacers adjacent the CBRAM stack.

14. The method of claim 13, further comprising selectively recessing the plurality of sacrificial layers to create an opening in alignment with the CBRAM stack.

15. The method of claim 14, wherein the plurality of sacrificial layers includes a first sacrificial layer, a second sacrificial layer, and a third sacrificial layer.

16. The method of claim 10, further comprising forming a low-k dielectric layer over the CBRAM stack and exposing a top surface of the CBRAM stack during a via opening.

17. The method of claim 16, further comprising filling the via opening with a conductive material.

18. The method of claim 10, wherein the electrolyte layer is a silicon monoxide (SiO) layer, the conductive layer includes copper (Cu), and the metal cap layer includes ruthenium (Ru).

* * * * *